United States Patent
Zheng et al.

(10) Patent No.: US 11,450,398 B2
(45) Date of Patent: Sep. 20, 2022

(54) METHOD OF TESTING SLAVE DEVICE OF INTER-INTEGRATED CIRCUIT BUS

(71) Applicant: REALTEK SEMICONDUCTOR CORPORATION, Hsinchu (TW)

(72) Inventors: De-Pin Zheng, Suzhou (CN); Dong Qiu, Suzhou (CN); Xiang-Hua Shen, Suzhou (CN); Fei Yan, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 18 days.

(21) Appl. No.: 17/156,679

(22) Filed: Jan. 25, 2021

(65) Prior Publication Data

US 2021/0265001 A1 Aug. 26, 2021

(30) Foreign Application Priority Data

Feb. 26, 2020 (CN) .......................... 202010118494.9

(51) Int. Cl.
*G11C 29/38* (2006.01)
*G06F 13/16* (2006.01)

(52) U.S. Cl.
CPC .......... *G11C 29/38* (2013.01); *G06F 13/1668* (2013.01); *G06F 2213/0016* (2013.01)

(58) Field of Classification Search
CPC ... G11C 29/38; G11C 29/025; G06F 13/1668; G06F 2213/0016; G06F 11/2273;

(Continued)

(56) References Cited

U.S. PATENT DOCUMENTS 6,145,036 A * 11/2000 Barenys .............. G06F 13/4291
714/48
7,234,081 B2 * 6/2007 Nguyen ................. G11C 29/02
714/733

(Continued)

FOREIGN PATENT DOCUMENTS

CN 101051434 A 10/2007
CN 101604277 B 3/2012

(Continued)

OTHER PUBLICATIONS

Authors et al., I2C with Bitwise Parity, Slave Acknowledgement on Read, and Slave Request Function, Nov. 10, 2008, IP.com, pp. 1-15. (Year: 2008).*

(Continued)

*Primary Examiner* — John J Tabone, Jr.
(74) *Attorney, Agent, or Firm* — WPAT, PC

(57) ABSTRACT

A method of testing a slave device of an Inter-Integrated Circuit (I²C) bus is provided. The method includes the following steps: (A) starting a first read operation or a first write operation of the slave device, the first read operation or the first write operation including a sub-operation of sending a command, an acknowledgement signal, data, an address or a control byte to the slave device; (B) sending a start command or an end command to the slave device after or during the sub-operation; (C) after step (B), performing a second read operation or a second write operation on the slave device; and (D) after step (C), determining whether the second read operation or the second write operation is correctly performed.

14 Claims, 8 Drawing Sheets

(58) Field of Classification Search
CPC ............... G06F 11/1048; G06F 11/221; G06F 13/4282; H04L 1/1607
USPC .................................. 714/719, 724; 710/110
See application file for complete search history.

(56) References Cited

U.S. PATENT DOCUMENTS

| | | | | |
|---|---|---|---|---|
| 7,589,652 | B2* | 9/2009 | Lee .......................... | H03M 1/66 341/144 |
| 8,489,786 | B2* | 7/2013 | Radhakrishnan ... | G06F 13/4291 710/110 |
| 10,198,382 | B2* | 2/2019 | Danis .................. | G06F 13/4282 |
| 10,416,602 | B1* | 9/2019 | Fister .................... | G03G 15/55 |
| 2005/0188281 | A1* | 8/2005 | Nguyen ................. | G11C 29/02 714/42 |
| 2007/0088874 | A1* | 4/2007 | Brabant ................. | G06F 13/387 710/62 |
| 2007/0240011 | A1* | 10/2007 | Saripalli ............. | G06F 13/4291 713/500 |
| 2008/0252505 | A1* | 10/2008 | Lee .......................... | H03M 1/66 341/146 |
| 2010/0117691 | A1* | 5/2010 | Lory .................. | H04L 12/40019 315/250 |
| 2010/0122002 | A1* | 5/2010 | Lory .................... | H04L 12/403 710/110 |
| 2011/0113171 | A1* | 5/2011 | Radhakrishnan ... | G06F 13/4291 710/110 |
| 2016/0364305 | A1* | 12/2016 | Pitigoi-Aron ......... | G06F 11/221 |
| 2020/0333754 | A1* | 10/2020 | Lin ....................... | G05B 19/042 |

FOREIGN PATENT DOCUMENTS

| | | |
|---|---|---|
| CN | 103139010 B | 9/2016 |
| TW | 201945957 A | 12/2019 |

OTHER PUBLICATIONS

OA letter of the counterpart TW application (appl. No. 109106920) dated Jan. 10, 2022. Summary of the QA letter: (1) Claim(s) 1 and 4 is/are rejected under Patent Law Article 26(2) as being indefinite. (2) Claim(s) 5-9 is/are rejected under Patent Law Article 22(2) as being unpatentable over reference 1 (TW 201945957A).) Claim correspondence between the TW counterpart application and the instant US application: Claims 1-10 in the TW counterpart application correspond to claims 1, 3, 4, 6, 7, 10, 11, 12, 13, and 15 in the instant US application, respectively.

OA letter of the counterpart CN application (appl. No 202010118494.9) dated Mar. 22, 2022. Summary of the OA letter: Claims 1-10 are rejected under Chinese Patent Act §22-3 as being unpatentable over D1 (CN101051434) in view of D2(CN103139010).

* cited by examiner

METHOD OF TESTING SLAVE DEVICE OF INTER-INTEGRATED CIRCUIT BUS

BACKGROUND OF THE INVENTION

1. Field of the Invention

The present invention generally relates to the Inter-Integrated Circuit ($I^2C$) bus, and, more particularly, to methods of testing the slave device of the $I^2C$ bus (i.e., the $I^2C$-bus slave device).

2. Description of Related Art

Being nowadays widely used in integrated circuit designs, the $I^2C$ bus interface is a communication interface which is convenient to connect and simple in structure with ease of use. Through a serial data line (SDA) and a serial clock line (SCL), the $I^2C$ bus achieves data transmission between the master device and the slave device and identifies each device based on addresses. The $I^2C$ bus is widely used due to its simple structure and effectiveness of signal transmission.

Errors in the $I^2C$ bus can be found in advance by verifying and testing its electrical performance. However, in practical operations errors unrelated to electrical performance are commonly seen, and most of these errors are caused by unanticipated operations by the user. Therefore, it is necessary to conduct a more comprehensive test on the $I^2C$ buses.

SUMMARY OF THE INVENTION

In view of the issues of the prior art, an object of the present invention is to provide methods of testing an $I^2C$-bus slave device, so as to make an improvement to the prior art.

A method of testing a slave device of an Inter-Integrated Circuit ($I^2C$) bus is provided. The method includes the following steps: (A) starting a first read operation or a first write operation of the slave device, wherein the first read operation or the first write operation includes a sub-operation of sending a command, an acknowledgement signal, data, an address or a control byte to the slave device; (B) sending a start command or an end command to the slave device after or during the sub-operation; (C) after step (B), performing a second read operation or a second write operation on the slave device; and (D) after step (C), determining whether the second read operation or the second write operation is correctly performed.

A method of testing a slave device of an $I^2C$ bus is also provided. The method includes the following steps: (A) starting a first read operation of the slave device, wherein the first read operation includes a sub-operation of reading data stored in the slave device; (B) sending a start command or an end command to the slave device after or during the sub-operation; (C) after step (B), performing a second read operation or a write operation on the slave device; and (D) after step (C), determining whether the second read operation or the write operation is correctly performed.

A method of testing a slave device of an $I^2C$ bus is also provided. The method includes the following steps: (A) sending a clock to the slave device; (B) starting a first read operation or a first write operation of the slave device, wherein the first read operation or the first write operation includes a sub-operation; (C) suspending sending the clock to the slave device or changing a frequency of the clock during the sub-operation; (D) after step (C), sending the clock to the slave device or restoring the frequency of the clock; (E) after step (D), performing a second read operation or a second write operation on the slave device; and (F) after step (E), determining whether the second read operation or the second write operation is correctly performed.

A method of testing a slave device of an $I^2C$ bus is also provided. The method includes the following steps: (A) starting a first read operation of the slave device, wherein the first read operation includes reading data stored in the slave device; (B) after reading at least one byte of the data, finishing the first read operation without sending an acknowledgement signal to the slave device; (C) after step (B), performing a second read operation or a write operation on the slave device; and (D) after step (C), determining whether the second read operation or the write operation is correctly performed.

According to embodiments of the present invention, the methods of testing the $I^2C$-bus slave device simulate various types of abnormal conditions. In comparison with the traditional technology, the test methods provided in the present invention can test whether the slave device can handle various abnormal conditions caused by the user's operation or the working environment.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

Figure 1:
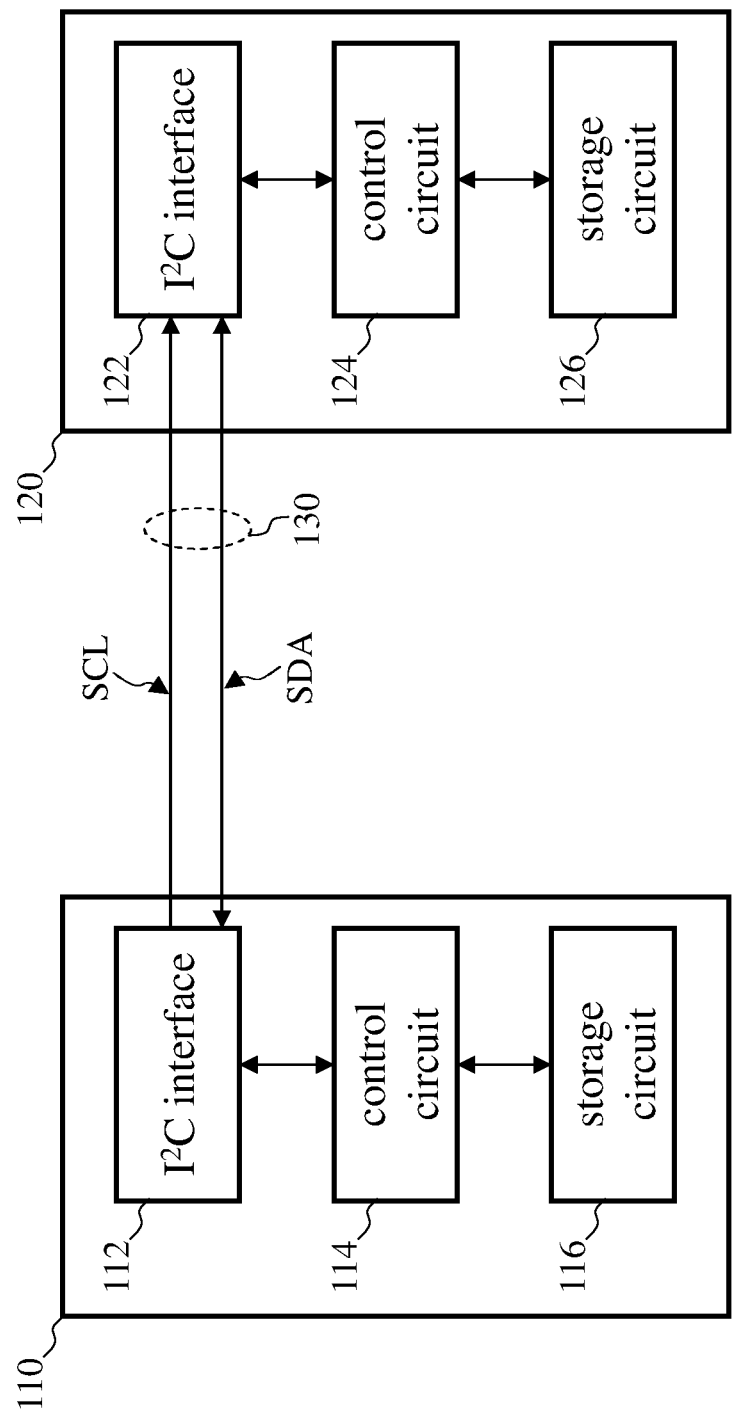
FIG. 1 shows the master device and slave device which are connected via the $I^2C$ bus.

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Throughout the drawings and the detailed description, the same reference numerals refer to the same or similar elements or steps.

FIG. 1 shows the master and slave devices connected via the I²C bus. The master device 110 includes an I²C interface 112, a control circuit 114 and a storage circuit 116. The slave device 120 includes an I²C interface 122, a control circuit 124 and a storage circuit 126. The master device 110 and the slave device 120 are connected through the I²C bus 130. The master device 110 sends the clock to the slave device 120 through the serial clock line SCL. Through the serial data line SDA, the master device 110 sends data, commands or other signals to the slave device 120 and receives data or signals sent by the slave device 120. The storage circuit 116 and the storage circuit 126 include a volatile memory and/or a non-volatile memory and store program codes or program instructions. The control circuit 114 implements the functions of the master device 110 and the test methods of the present invention by executing the program codes or program instructions in the storage circuit 116. The control circuit 124 implements the functions of the slave device 120 by executing the program codes or program instructions in the storage circuit 126.

Figure 2:
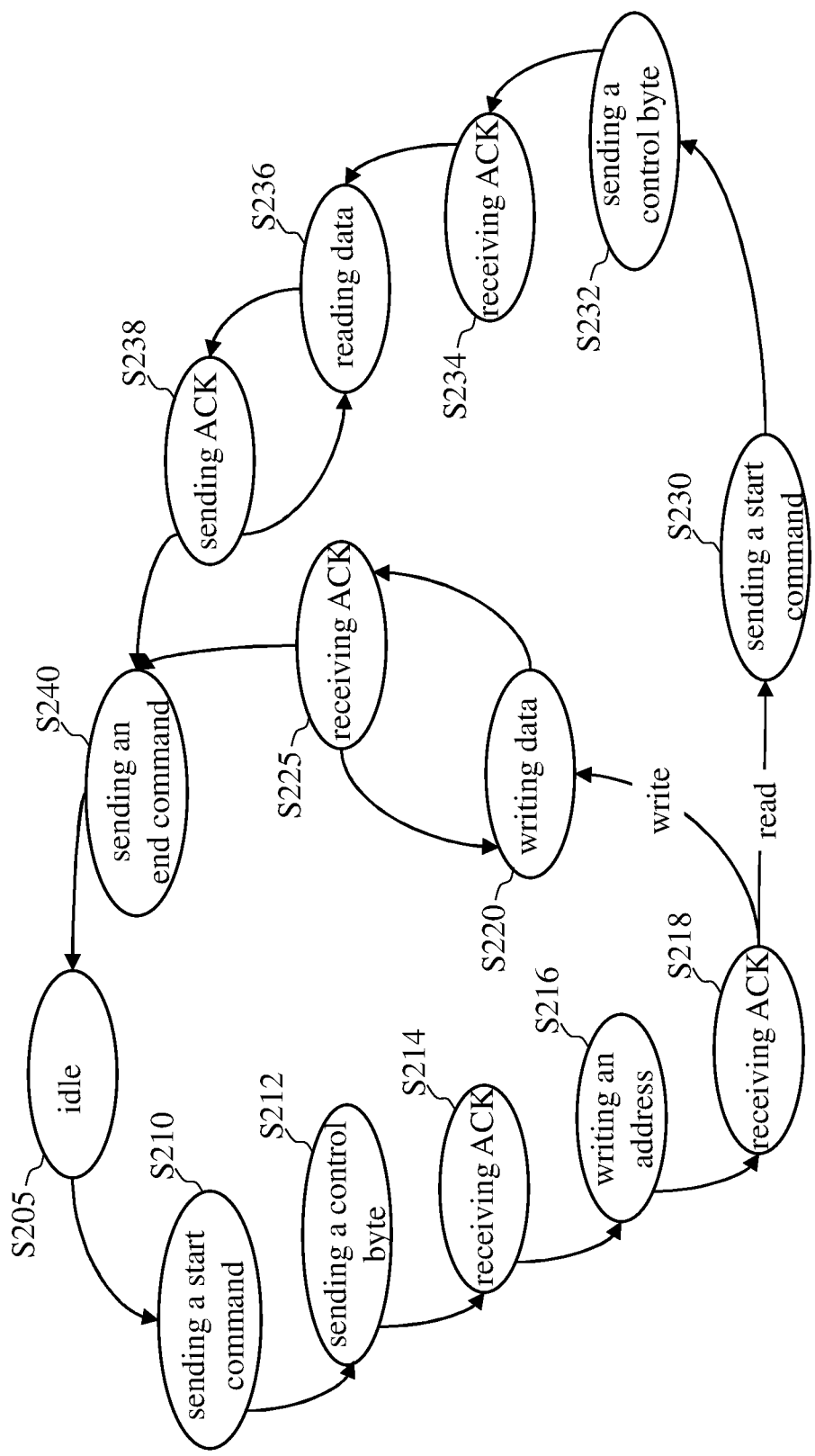
FIG. 2 shows the state machine of the master device according to one embodiment.
Figure 3:
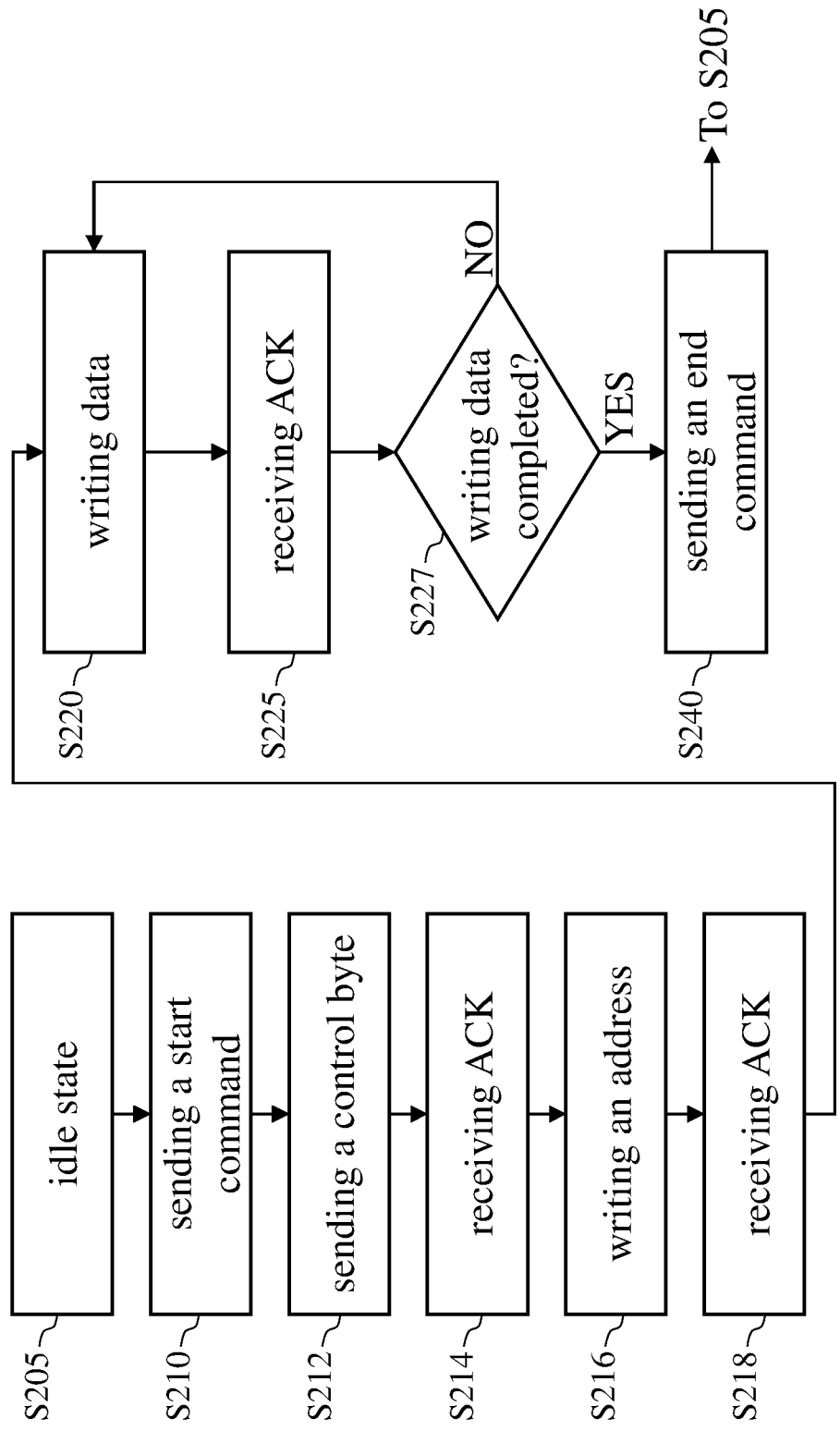
FIG. 3 is a flowchart of the master device performing a write operation on the slave device.
Figure 4:
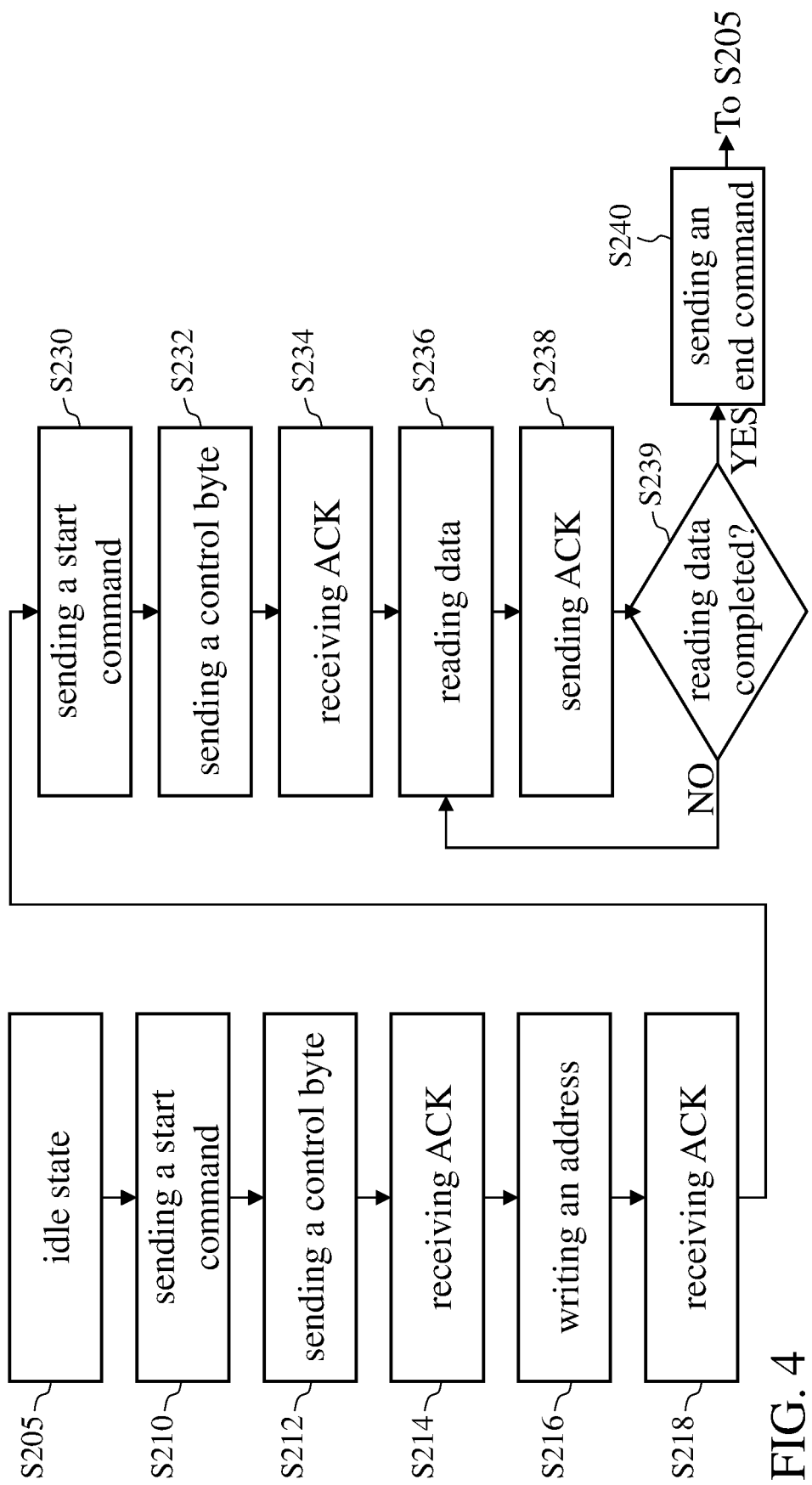
FIG. 4 is a flowchart of the master device performing a read operation on the slave device.

The present invention tests or verifies an I²C-bus slave device by means of a state machine. FIG. 2 shows the state machine of the master device 110 according to one embodiment, FIG. 3 shows a flowchart of the master device 110 performing a write operation on the slave device 120, and FIG. 4 shows a flowchart of the master device 110 performing a read operation on the slave device 120. Reference is made to FIG. 2 to FIG. 4. The write operation and the read operation have shared steps S205, S210, S212, S214, S216 and S218. After leaving the idle state (i.e., leaving step S205), the master device 110 first sends the start command (step S210) and then immediately sends the control byte corresponding to writing data (step S212) to notify the slave device 120 that the master device 110 is about to write data. After receiving the control byte, the slave device 120 sends an acknowledgement signal ACK to the master device 110. After confirming the receipt of the acknowledgement signal ACK (step S214), the master device 110 writes an address to the slave device 120 (step S216) and then waits for the slave device 120 to send the acknowledgement signal ACK. The address indicates a storage space of the storage circuit 126, and the master device 110 is about to write data to the storage space or read data stored in the storage space. After receiving the acknowledgement signal ACK (step S218), the master device 110 executes the flow of FIG. 3 or the flow of FIG. 4 according to whether data is to be written to the slave device 120 or read from the slave device 120.

Reference is made to FIG. 3. In the write operation, the master device 110 starts to write data to the slave device 120 (step S220) after step S218. More specifically, in step S220, the master device 110 sends the to-be-written data to the slave device 120; the control circuit 124 of the slave device 120 writes the to-be-written data into the storage space corresponding to the address provided in step S216 and then sends the acknowledgement signal ACK to the master device 110. After receiving the acknowledgement signal ACK (step S225), the master device 110 checks whether there is still data to be written (step S227). If there is still data to be written (which means that the write operation has not yet been completed) (NO branch of step S227), the master device 110 continues to write data to the slave device 120 (step S220). If the write operation has been completed (YES branch of step S227), the master device 110 sends an end command to the slave device 120 (step S240) before going back to the idle state (step S205).

Reference is made to FIG. 4. In the read operation, the master device 110 sends a start command to the slave device 120 (step S230) after step S218 and then immediately sends a control byte corresponding to reading data (step S232) to notify the slave device 120 that the master device 110 is about to read data. The slave device 120 sends an acknowledgement signal ACK to the master device 110 after receiving the control byte. The master device 110 starts to read data from the slave device 120 (steps S236 to S239) after confirming the receipt of the acknowledgement signal ACK (step S234). More specifically, in step S236, the control circuit 124 of the slave device 120 reads data from the storage space corresponding to the address provided in step S216 and sends the data to the master device 110. After receiving the data, the master device 110 sends an acknowledgement signal ACK to the slave device 120 (step S238) and then checks, according to the specification of the I²C bus, whether the read operation has been completed (step S239). If the read operation has not yet been completed (NO branch of step S239), the master device 110 continues to receive data from the slave device 120 (steps S236 to S238). If the read operation has been completed (YES branch of step S239), the master device 110 sends an end command to the slave device 120 (step S240) before going back to the idle state (step S205).

It should be noted that in steps S220 and S225 of FIG. 3, the master device 110 receives an acknowledgement signal ACK from the slave device 120 each time the master device 110 has written one byte of data to the slave device 120, and that in steps S236 and S238 of FIG. 4, the master device 110 sends an acknowledgement signal ACK to the slave device 120 each time the master device 110 has received one byte of data from the slave device 120.

The start command is represented by the serial data line SDA being at the falling edge while the serial clock line SCL being at the high level, and the end command is represented by the serial data line SDA being at the rising edge while the serial clock line SCL being at the high level.

The control byte corresponding to writing data (i.e., the control byte in step S212, which can also be referred to as a write command) and the control byte corresponding to reading data (i.e., the control byte in step S232, which can also be referred to as a read command) are both 8-bit commands or data. In some embodiments, the first seven bits of the two control bytes are the same, while the eighth bit is set to zero for writing data and one for reading data.

Figure 5:
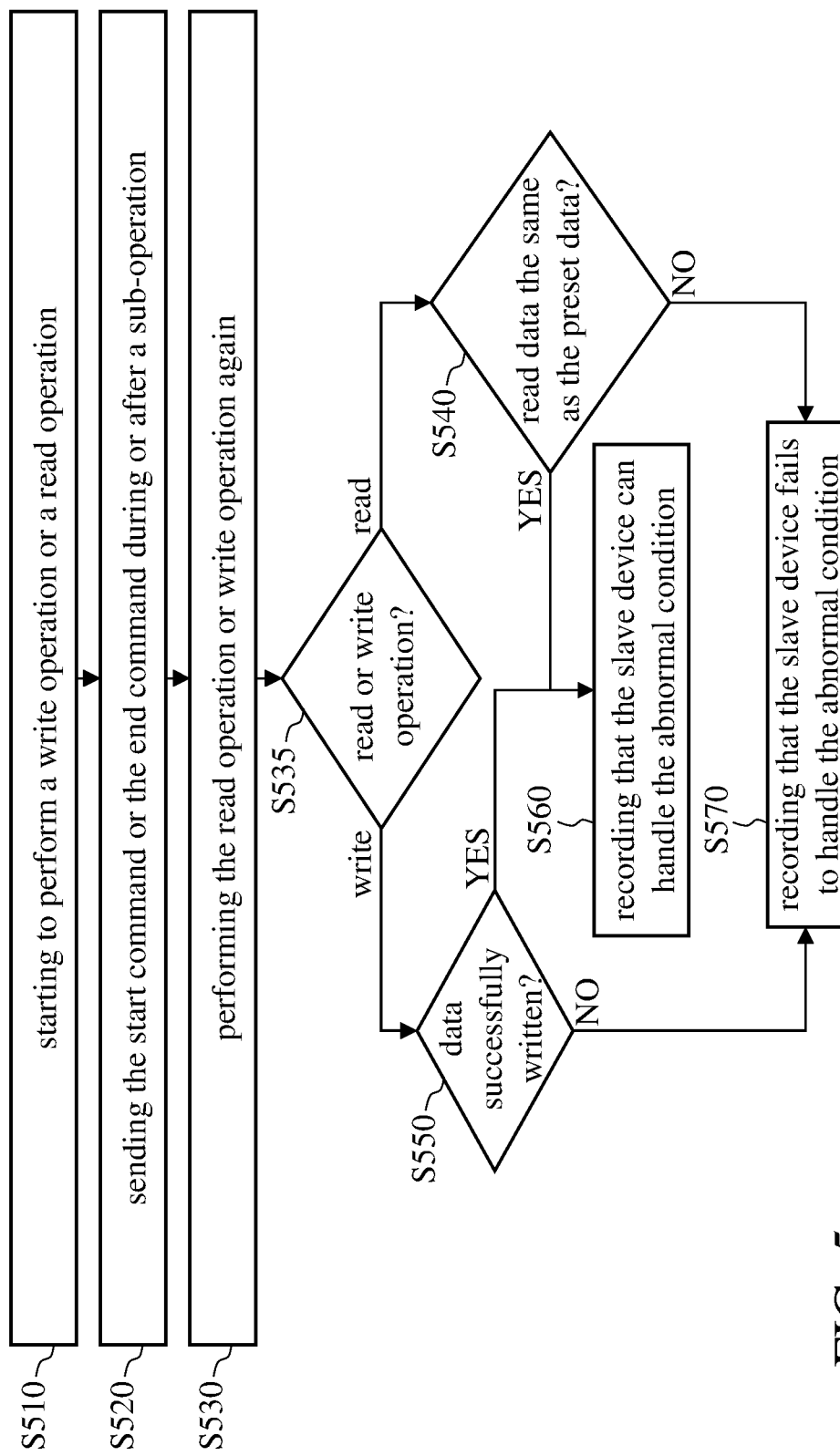
FIG. 5 is a flowchart of a method of testing an $I^2C$-bus slave device according to an embodiment of the present invention.

FIG. 5 is a flowchart of a method of testing an I²C-bus slave device according to an embodiment of the present invention. The master device 110 starts to perform a write operation or a read operation on the slave device 120 (step S510) (the flows of the write operation and the read operation are shown in FIGS. 3 and 4, respectively). Then, the master device 110 sends the start command or the end command to the slave device 120 during or subsequent to a sub-operation of sending data/command/signal to the slave device 120 (step S520). This sub-operation is part of the write operation or read operation. Reference is made to FIGS. 3 and 4. The data/command/signal in discussion can be the start command (i.e., the sub-operation being step S210), the acknowledgement signal ACK (i.e., the sub-operation being step S238), data (i.e., the sub-operation being step S220), the address (i.e., the sub-operation being step S216), or the control byte (i.e., the sub-operation being step S212 or S232). More specifically, step S520 is aimed to simulate an abnormal condition of unanticipated reception of the start command or the end command by the slave device 120, by way of sending, by the master device 110, the start command or the end command to the slave device 120 subsequent to having sent the start command, acknowledgement signal ACK, data, address or control byte, or in the course of sending the data, address or control byte, to the slave device 120. It should be noted that in the case where the sub-operation is step S210, the master device 110 sends the end command, rather than the start command, to the slave device 120 after step S210 finishes.

The abnormal condition that the master device 110 causes to occur during the sub-operation is defined herein as the master device 110 sending the start command or the end command after any bit other than the last bit of the data, address, or control byte. On the other hand, the abnormal condition that the master device 110 causes to occur after the sub-operation finishes is defined herein as the master device 110 sending the start command or the end command after the last bit of the data, address, or control byte, or after finishing sending the start command or acknowledgement signal ACK.

After step S520 finishes, the master device 110 goes back to the idle state (step S205), and then performs the read operation or write operation on the slave device 120 again (step S530). More specifically, the read operation or write operation of step S510 is interrupted by the abnormal condition caused to occur in step S520, whereas the read operation or write operation of step S530 is a complete operation (i.e., no interruption). Then, the master device 110 determines whether the read operation or write operation of step S530 has been correctly conducted (steps S535 to S570).

If the master device 110 performs the read operation in step S530, the master device 110 compares the read data with the preset data to check whether they are the same (step S540). The preset data is, for example, data stored in advance in the storage circuit 126, and the master device 110 knows the content of the data. If step S540 is YES, the master device 110 concludes (e.g., by recording) that the slave device 120 can handle the abnormal condition caused to occur in step S520 (step S560). If step S540 is NO, the master device 110 concludes (e.g., by recording) that the slave device 120 fails to handle the abnormal condition caused to occur in step S520 (step S570). After step S560 or S570 finishes, the master device 110 goes back to the idle state (step S205).

If the master device 110 performs the write operation in step S530, the master device 110 executes step S560 or S570 according to whether the data is successfully written to the slave device 120 (step S550).

Figure 6:
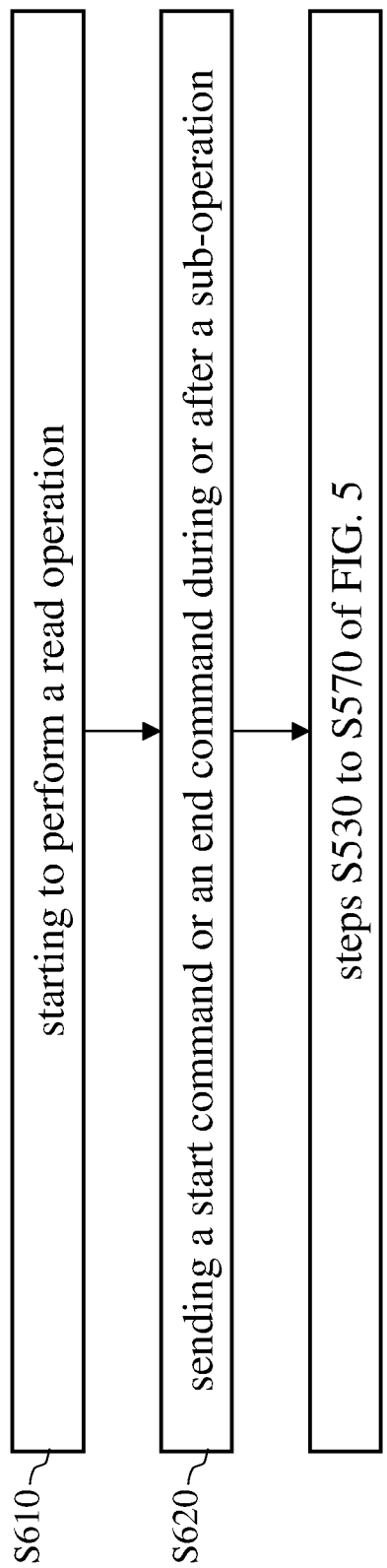
FIG. 6 is a flowchart of a method of testing an $I^2C$-bus slave device according to another embodiment of the present invention.

FIG. 6 is a flowchart of a method of testing an I²C-bus slave device according to another embodiment of the present invention. The master device 110 starts to perform a read operation on the slave device 120 (step S610) (the flow of the read operation is shown in FIG. 4). Then, the master device 110 sends a start command or an end command to the slave device 120 in the course of or subsequent to a sub-operation (step S620). The sub-operation is part of the read operation, and the sub-operation is an operation in which the master device 110 reads the data stored in the storage circuit 126 of the slave device 120. Reference is made to FIG. 4. The sub-operation in discussion may be step S236. More specifically, the reception of a byte that the slave device 120 sends by the master device 110 is the sub-operation discussed in step S620, wherein complete reception of eight bits of the byte by the master device 110 indicates the end of the sub-operation, while the course of the sub-operation is any time before the complete reception of eight bits of the byte by the master device 110. The test process of FIG. 6 simulates the abnormal condition that the slave device 120 receives the start command or the end command in the course of sending data (i.e., prior to the reception of the acknowledgement signal ACK that the master device 110 sent (step S238)).

After step S620 is finished, the master device 110 returns to the idle state (step S205), and then performs the read or write operation on the slave device 120 again (step S530). Steps S530, S535, S540, S550, S560 and S570 in FIG. 6 are the same as those in FIG. 5, and the details are thus omitted for brevity.

Figure 7:
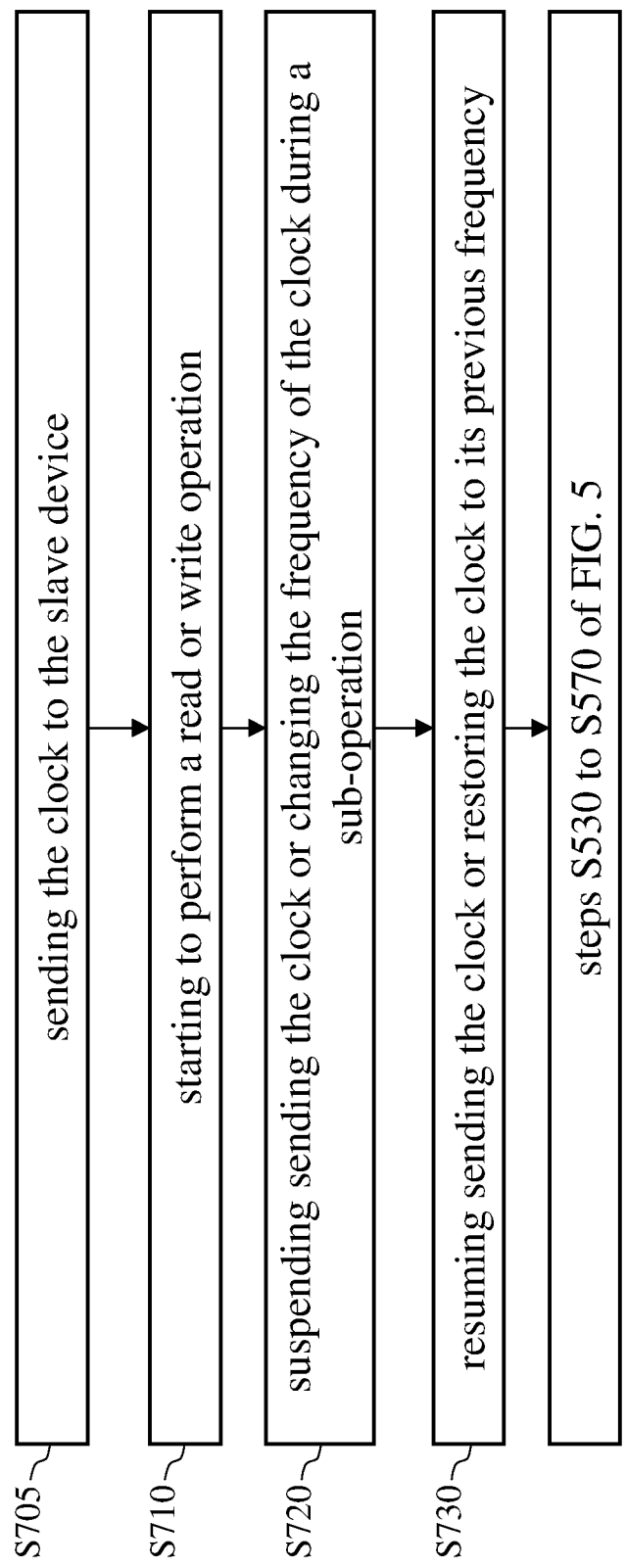
FIG. 7 is a flowchart of a method of testing an $I^2C$-bus slave device according to another embodiment of the present invention.

FIG. 7 is a flowchart of a method of testing an I²C-bus slave device according to another embodiment of the present invention. The master device 110 sends the clock to the slave device 120 through the serial clock line SCL (step S705), and then starts to perform a read or write operation on the slave device 120 (step S710). The flows of the write operation and the read operation are shown in FIGS. 3 and 4, respectively. Next, during a sub-operation, the master device 110 suspends sending the clock (e.g., for a period of 1 ms-10 ms) to the slave device 120 or changes the frequency of the clock (step S720). This sub-operation is part of the write operation or read operation and can be any step other than step S205 in FIGS. 2 to 4.

After step S720 is finished, the master device 110 resumes sending the clock to the slave device 120 or changes the frequency of the clock back to normal (i.e., restoring the clock to its previous frequency prior to the change) (step S730).

The test process in FIG. 7 simulates clock interruption and clock jitter (i.e., frequency change), which are also types of the abnormal conditions. When the clock is interrupted or the frequency is changed, the slave device 120 may not be able to complete the read or write operation in progress (i.e., the read or write operation started in step S710). However, whether the slave device 120 has completed the read or write operation, the master device 110 returns to the idle state (step S205) after step S730 and then performs the read or write operation on the slave device 120 again (step S530). Steps S530, S535, S540, S550, S560 and S570 in FIG. 7 are the same as those in FIG. 5, and the details are thus omitted for brevity.

Figure 8:
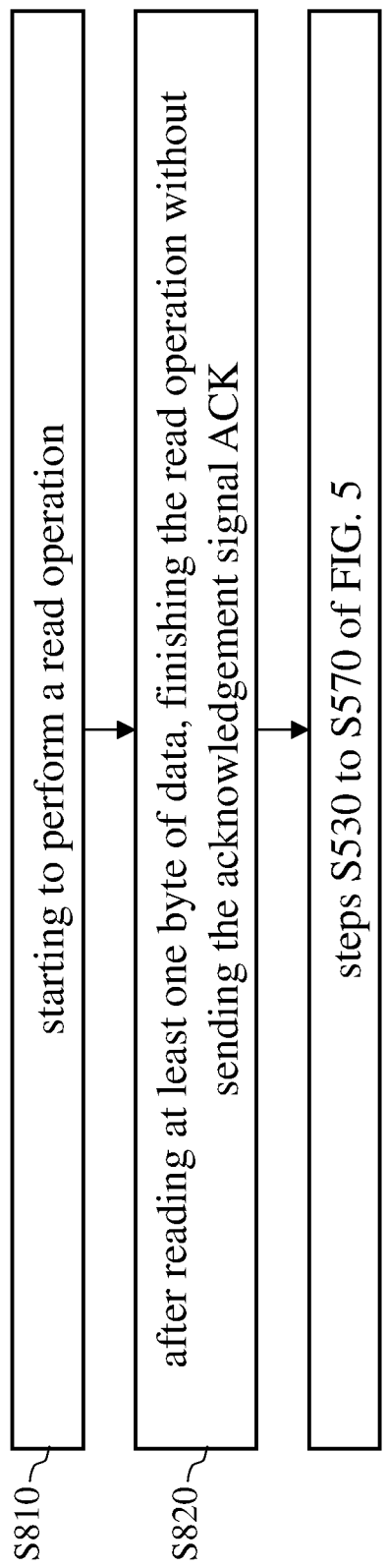
FIG. 8 is a flowchart of a method of testing an $I^2C$-bus slave device according to another embodiment of the present invention.

FIG. 8 is a flowchart of a method of testing an I²C-bus slave device according to another embodiment of the present invention. The master device 110 starts to perform a read operation on the slave device 120 (step S810) (the flow of the read operation is shown in FIG. 4). Next, after reading at least one byte of data in step S236, the master device 110 does not send the acknowledgement signal ACK to the slave device 120 (i.e., not performing step S238), but rather waits for 1 ms-3 ms before returning to the idle state (step S205) to finish the read operation (step S820). Then, the master device 110 performs a read or write operation on the slave device 120 again (step S530). Steps S530, S535, S540, S550, S560 and S570 in FIG. 8 are the same as those in FIG. 5, and the details are thus omitted for brevity. The test process of FIG. 8 simulates the abnormal condition that the slave device 120 fails to receive the acknowledgement signal ACK during the read operation.

In some embodiments, simulations of two or more abnormal conditions of FIGS. 5 through 8 are conducted in a single read or write operation. For example, the master device 110 may send a start command or an end command in both step S212 and step S216 (i.e., step S520 in FIG. 5 includes two sub-operations). For another example, which is a combination of the abnormal conditions illustrated in FIGS. 7 and 8, the master device 110 may change the frequency of the clock on the serial clock line SCL in step S230, and does not send the acknowledgement signal ACK during the read operation (i.e., not performing step S238).

In some embodiments, the abnormal conditions of FIGS. 5 through 8 may be randomly generated. For example, the control circuit 114 of the master device 110 randomly generates a target value and starts counting in step S210 of FIG. 3 or 4, and then causes the abnormal condition(s) to occur when the count equals the target value. The master device 110 can count according to the clock on the serial clock line SCL or the system clock. The system clock is, for example, the working clock of the control circuit 114, and its frequency may be the same as or different from the frequency of the clock on the serial clock line SCL.

In other embodiments, the master device 110 generates abnormal condition(s) at specific time point(s). For example, in the embodiment of FIG. 6, the master device 110 starts counting after receiving the acknowledgement signal ACK in step S234, and the target value(s) is/are between 1 and 32 (i.e., within 4 bytes of data). When the count equals the target value, a start command or an end command is sent to the slave device 120 (step S620). The target value(s) may be more than one, such as 1, 10 and 32, in which case, the master device 110 sends the start command or the end command to the slave device 120 after the reception of the first bit (i.e., during step S236), after the reception of the tenth bit (i.e., during step S236), and after the reception of the $32^{nd}$ bit (i.e., after step S236 finishes).

Since a person having ordinary skill in the art can appreciate the implementation detail and the modification thereto of the present method invention through the disclosure of the device invention, repeated and redundant description is thus omitted. Please note that there is no step sequence limitation for the method inventions as long as the execution of each step is applicable. Furthermore, the shape, size, and ratio of any element and the step sequence of any flowchart in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A method of testing a slave device of an Inter-Integrated Circuit ($I^2C$) bus, comprising:
   (A) starting a first read operation or a first write operation of the slave device, wherein the first read operation or the first write operation comprises a sub-operation of sending a command, an acknowledgement signal, data, an address or a control byte to the slave device;
   (B) sending a start command or an end command to the slave device after or during the sub-operation;
   (C) after step (B), performing a second read operation or a second write operation on the slave device; and
   (D) after step (C), determining whether the second read operation is correctly performed by comparing data obtained in the second read operation with preset data, or determining whether the second write operation is correctly performed by checking whether data to be written in the second write operation is successfully written.

2. The method of claim 1, wherein the command is the start command, and step (B) sends the end command to the slave device.

3. The method of claim 1, wherein the control byte corresponds to a write command.

4. The method of claim 1, wherein the control byte corresponds to a read command.

5. The method of claim 1, wherein the slave device comprises a storage circuit, and the data is about to be written into the storage circuit.

6. A method of testing a slave device of an Inter-Integrated Circuit ($I^2C$) bus, comprising:
   (A) starting a first read operation of the slave device, wherein the first read operation comprises a sub-operation of reading data stored in the slave device;
   (B) sending a start command or an end command to the slave device after or during the sub-operation;
   (C) after step (B), performing a second read operation or a write operation on the slave device; and
   (D) after step (C), determining whether the second read operation is correctly performed by comparing data obtained in the second read operation with preset data, or determining whether the write operation is correctly performed by checking whether data to be written in the write operation is successfully written.

7. A method of testing a slave device of an Inter-Integrated Circuit ($I^2C$) bus, comprising:
   (A) sending a clock to the slave device;
   (B) starting a first read operation or a first write operation of the slave device, wherein the first read operation or the first write operation comprises a sub-operation;
   (C) suspending sending the clock to the slave device or changing a frequency of the clock during the sub-operation;
   (D) after step (C), sending the clock to the slave device or restoring the frequency of the clock;
   (E) after step (D), performing a second read operation or a second write operation on the slave device; and
   (F) after step (E), determining whether the second read operation is correctly performed by comparing data obtained in the second read operation with preset data, or determining whether the second write operation is correctly performed by checking whether data to be written in the second write operation is successfully written.

8. The method of claim 7, wherein the sub-operation is an operation of sending a start command to the slave device.

9. The method of claim 7, wherein the sub-operation is an operation of sending a control byte to the slave device.

10. The method of claim 7, wherein the sub-operation is an operation of sending an acknowledgement signal to the slave device.

11. The method of claim 7, wherein the sub-operation is an operation of receiving an acknowledgement signal sent by the slave device.

12. The method of claim 7, wherein the sub-operation is an operation of sending an address to the slave device.

13. The method of claim 7, wherein the sub-operation is an operation of sending data to the slave device.

14. The method of claim 7, wherein the sub-operation is an operation of reading data stored in the slave device.

* * * * *